(12) United States Patent
Ghyselen et al.

(10) Patent No.: US 6,908,774 B2
(45) Date of Patent: Jun. 21, 2005

(54) METHOD AND APPARATUS FOR ADJUSTING THE THICKNESS OF A THIN LAYER OF SEMICONDUCTOR MATERIAL

(75) Inventors: Bruno Ghyselen, Seyssinet-Pariset (FR); Cécile Aulnette, Grenoble (FR); Bénédite Osternaud, Saint Egreve (FR)

(73) Assignee: S.O. I. Tec Silicon on Insulator Technologies S.A., Bernin (FR)

( * ) Notice: Subject to any disclaimer, the term of this patent is extended or adjusted under 35 U.S.C. 154(b) by 31 days.

(21) Appl. No.: 10/637,078

(22) Filed: Aug. 6, 2003

(65) Prior Publication Data
US 2004/0152311 A1 Aug. 5, 2004

Related U.S. Application Data
(60) Provisional application No. 60/467,240, filed on Apr. 30, 2003.

(30) Foreign Application Priority Data

Aug. 12, 2002 (FR) .............................................. 02 10209
Aug. 12, 2002 (FR) .............................................. 02 10208

(51) Int. Cl.$^7$ .......................... H01L 31/26; H01L 21/66
(52) U.S. Cl. .......................... 438/14; 438/770; 438/981
(58) Field of Search ........................... 438/14, 18, 165, 438/476, 479, 770, 981

(56) References Cited

U.S. PATENT DOCUMENTS

| | | | | |
|---|---|---|---|---|
| 5,170,049 A | * | 12/1992 | De Jonge et al. | 250/225 |
| 6,096,233 A | | 8/2000 | Taniyama et al. | 216/92 |
| 6,111,634 A | | 8/2000 | Pecen et al. | 356/72 |
| 6,406,924 B1 | | 6/2002 | Grimbergen et al. | 438/9 |
| 2002/0102749 A1 | | 8/2002 | Fielden et al. | 438/14 |
| 2002/0103564 A1 | | 8/2002 | Fielden et al. | 700/121 |

FOREIGN PATENT DOCUMENTS

| | | |
|---|---|---|
| EP | 0881 040 | 12/1998 |
| FR | 2 797 714 | 2/2001 |
| WO | WO 02 257 08 | 3/2002 |

* cited by examiner

*Primary Examiner*—Phuc T. Dang
(74) *Attorney, Agent, or Firm*—Winston & Strawn LLP (57) ABSTRACT

A method for adjusting the thickness of a thin semiconductor material layer. The method includes measuring the layer to establish a thickness profile, determining thickness adjustment specifications from the measured thickness profile, and adjusting the thickness of the layer in accordance with the specifications by sacrificial oxidation. An apparatus for adjusting the thickness of a thin layer of semiconductor material according to this method is also disclosed.

25 Claims, 7 Drawing Sheets

METHOD AND APPARATUS FOR ADJUSTING THE THICKNESS OF A THIN LAYER OF SEMICONDUCTOR MATERIAL

This application claims the benefit of provisional application 60/467,240 filed Apr. 30, 2003.

BACKGROUND ART

The present invention relates to fabricating semiconductor components for microelectronics and/or optoelectronics. More precisely, the invention concerns fabricating and/or preparing thin layers for making such components, by measuring the thickness of the layers and then taking action to adjust thickness in accordance with specifications.

Such thin layers are made at the end of a fabrication facility and include a plurality of successive steps. The SMART-CUT® method is an example of such a method of fabrication. A general description of the method can be found in the work "Silicon-on-insulator technology: materials to VLS", 2nd edition by Jean-Pierre Colinge, (see pages 50 and 51 in particular). Such a method enables thin layers and films of semi-conductor material to be obtained. A variant of the method includes the following steps. During a first step, at least one face of a wafer of semiconductor material is oxidized. During a second step, a zone of weakness is created beneath a face of the wafer by ion implantation. During a "bonding", third step, the face of the wafer is put into close contact with a supporting substrate and is secured thereto. During a fourth step, the assembly including the wafer and the supporting substrate is subjected to treatment suitable for creating detachment in the wafer at the zone of weakness. During a fifth step, finishing techniques are conducted on the implantation face of the portion including the substrate to reduce the defects generated by the detachment, and/or to reduce the level of roughness to a suitably low level.

Examples of finishing techniques can be found in International Application Publication No. WO 01/15215 A1 which teaches a technique implementing annealing, and in International Application Publication No. WO 01/115218 which teaches a technique implementing polishing and oxidizing steps.

The SMART-CUT® method thus makes it possible to make multilayer silicon-on-insulator (SOI) type structures by retaining a layer of oxide as created during the first step on the implantation face of the wafer. Then, during the bonding step, the layer of oxide is interposed between the supporting substrate and the wafer.

Figures 1, 2:
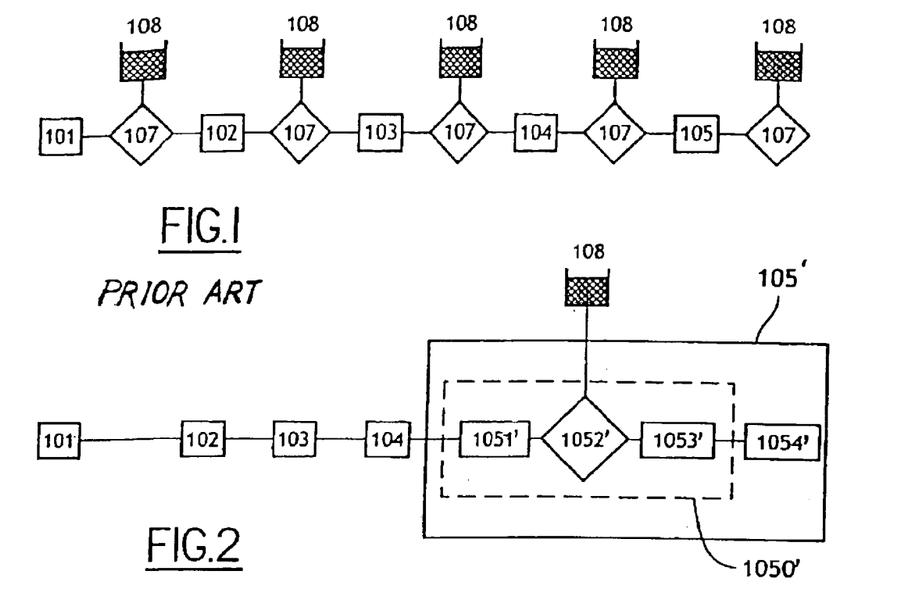
FIG. 1 diagrammatically illustrates the steps of a method of preparing SOI structures of the prior art.
FIG. 2 is a diagram showing an implementation of a method of preparing SOI structures of the SMART-CUT® type according to the present invention.

FIG. 1 illustrates a particular implementation in steps 101 to 105 of the SMART-CUT® method for fabricating an SOI structure, which are described below.

It should be understood that other types of methods also exist that enable SOI structures to be fabricated. Whatever the type of method implemented, each new step included in a fabrication facility necessarily requires handling of and/or intervention on the layers, thus leading to additional risk of fabrication defects.

One type of fault relates to a layer having a thickness that departs from the thickness specifications required by the manufacturer. Layers can be rejected because of defects resulting in the thickness of the layer not corresponding to the thickness specifications, in particular in terms of mean thickness of the layer, and/or non-uniformity of thickness within a given layer (often referred to as failure to satisfy the requirement for "within wafer" uniformity).

Layers are usually fabricated in batches, and it is also desirable to satisfy specifications for uniform thickness between the various layers of a given batch (referred to as "wafer-to-wafer" uniformity).

The batches may correspond to layers that have been subjected to the same fabricating steps, under the same conditions (same annealing, etc.) Batches may also correspond to a group of layers defined in some arbitrary way, e.g. they may correspond to production over a given time interval (one day or some other time interval). It is often desirable, at the end of fabrication, to achieve the same average thickness for all the layers of the batch (within some given tolerance, which typically is within a few percent).

It is also generally desirable to achieve "batch-to-batch" uniformity between the layers of various batches, when the final thickness specifications (represented by an average thickness value, for example) are the same for the layers of various batches.

Thickness inspection steps implementing techniques for measuring the thicknesses of thin layers are therefore generally associated with certain steps for processing the layers, all along the fabrication facility. These inspection steps imply that layers will be rejected if they present thickness defects that are harmful to the proper operation of future electronic components.

Returning to the example of the main steps in a SMART-CUT® type method for preparing SOI as shown in FIG. 1, the thickness inspection steps are represented diagrammatically by the diamond-shaped lozenges 107. The thickness inspections occur downstream from each step in the method of preparing SOI, such as after the oxidizing step 101; after the ion implantation step 102; after the bonding step 103; after the heat treatment step 104; and after the finishing step 105.

It should be understood that the configuration shown in FIG. 1 is a "maximum" version of the implementation of thickness inspection steps 107. In reality, thickness inspection steps are not associated with each step in the method of preparing SOI, but only with some of the steps. If the thickness measured on a layer is satisfactory, then the layer moves on to the following step. Otherwise the element is rejected and scrapped at 108.

The conventional methods that include multiple layer thickness inspections lead to material being lost, and also to a consequent reduction in the rate of throughput of the fabrication facility. Throughput suffers as a result of the need to very closely inspect the fabrication steps which affect the thickness of the layers.

One solution for reducing those drawbacks would be to eliminate the various successive inspections of thickness, or to relax the constraints associated therewith by including a thickness correcting step at the end of fabrication. It would then be possible to relax the constraints associated with the various steps of the layer fabrication process, thereby simplifying and accelerating the operation of the process. Consequently, it is important to implement methods and apparatuses that correct thickness in a manner that is effective and accurate, particularly since the thicknesses of thin layers are becoming smaller year after year due to layer-preparation technique improvements.

A first attempt at satisfying such requirements is proposed by the so-called plasma assisted chemical etching (PACE) method described in the document "Semiconductor wafer bonding: science and technology", by Q. Y. Tong and U. Gösele. The main steps of the PACE method are, in outline, as follows. After acquiring thickness measurements of a thin layer by means of an optical reflection technique, a control unit responds to the measurements it receives by deducing specifications for correcting the thickness of the layer. The thickness adjustment apparatus receives the thickness adjustment specifications from the control unit and then corrects the thickness defects of the layer in application of the specifications. The thickness adjustment apparatus implemented by the PACE method uses a plasma assisted chemical etching technique. That technique is based on using a chemical etching technique that is localized relative to the layer.

A tool applying such techniques is thus suitable for removing material from the layer. Since the tool removes material from an area that is much smaller than the area of the layer, thickness adjustment is thus performed locally on the layer. Since the tool is also suitable for moving over the layer, it travels over all or part of the layer following a path that comprises a plurality of sequences, each lasting for a certain length of time.

The layer adjustment specifications previously generated by the control unit define the path sequences and the etching times. Such specifications are directly linked with a map of thicknesses as deduced from the measurements performed on the layer.

This method of thickness reduction thus seeks to apply treatment that is adapted to the thickness characteristics of each fabricated layer, and to perform individual repair operations on each layer.

The PACE method relating to the thickness adjustment apparatus using the plasma assisted chemical etching technique nevertheless suffers from several drawbacks. First, the conditions under which such technology are implemented are highly constraining. The reaction chamber in which etching is implemented is fouled by the etching operations and therefore requires frequent maintenance. Further, the need to establish a vacuum in the reaction chamber is an additional constraint in terms of implementing such a method, since a high vacuum requires large and expensive pumping means, significant sealing means, and high-performance monitoring means. Second, the very principle of moving the tool that removes material over the layer along a path that is associated with locally removing material by etching leads to lengthy and laborious treatment of the layer. Including such a step of treating layers by etching in a facility for mass producing thin layers is therefore difficult since the rate at which thin layers enter and leave the etching chamber slows production down.

Third, plasma assisted chemical etching technology itself suffers from drawbacks, some of which are further amplified when it comes to treating very thin layers. As mentioned above, it is desirable to fabricate layers of ever decreasing thickness, making it more and more important to control the quantity of material that is removed very finely. In particular, exposing a thin layer to a plasma in a highly reactive environment can lead to defects being created in the crystal structure and to charge accumulating within the layer. This is particularly harmful when the layer is thin. This limitation means that PACE applications are limited in practice to layers having an average thickness of more than 1 micrometer ($\mu$m).

The resolution of the PACE technique is limited in practice to accuracy over the thickness that is finally obtained that is of the order of a few hundreds of angstroms (Å). This accuracy thus makes it possible to produce layers having thickness of the order of 1 $\mu$m with precision of the order of a few percent. However, with very thin layers, where the desired thickness may be of the order of 1000 Å, for example, tolerance of a few percent in the final thickness corresponds to resolution of a few tens of angstroms, and that cannot be envisaged with the above-mentioned PACE technique.

The PACE technique is therefore unsuited to correcting the thickness of thin layers when the mean thickness thereof is less than a value of 1 $\mu$m. Lastly, it is very difficult to control the characteristics of the plasma implemented in PACE in such a manner as to treat substrates of large dimensions. It thus appears that the attempted solution corresponding to the PACE method suffers from numerous limitations.

A second attempt at satisfying the need to implement methods and apparatuses for correcting thickness in effective and accurate manner is also known. International Patent publication document no. WO 01/83238 in the name of Epion Corporation discloses an example of the second type of technique.

However in that case also, some of the limitations mentioned above with respect to the PACE technique continue to apply. In particular, the technique proposed by Epion is expensive and complex to implement. It is also necessary in that case to establish a vacuum in the reaction chamber. Another major limitation of the Epion technique is again that individualized treatment is performed sequentially on different zones of a layer, which leads to treatment times that are lengthy. Moreover, this second type of technique does not make it possible to achieve levels of roughness that are small enough for the intended applications, in particular when fabricating SOI.

The term "simultaneously" used herein means that the various zones of the surface of the layer are treated at substantially the same time.

Thus, the various attempts mentioned above suffer from limitations.

SUMMARY OF THE INVENTION

A method for adjusting the thickness of a thin semiconductor material layer is provided. The technique includes measuring the layer to establish a thickness profile, determining thickness adjustment specifications from the measured thickness profile, and adjusting the thickness of the layer in accordance with the specifications by sacrificial oxidation.

The thickness adjustment specifications generally correspond to at least one of uniform thickness modification across the layer, or differential thickness modification across the layer. The thickness adjustment specifications may be established to produce a layer having a constant thickness over the entire layer.

The method according to the invention may further include applying thickness adjustments simultaneously to the layer surface. The technique may also include preparing batches of layers for adjustment of layer thicknesses, and may include performing layer thickness adjustment on the batches of layers. The method may also include defining a final target thickness profile for all layers of the batch, and individualizing the respective thickness adjustment specifications for each layer of the batch so that a final layer thickness profile of each layer of the batch is as close as possible to the final target thickness profile. The method may further include defining a single target thickness profile for all of the layers of the batch, and utilizing the same thickness adjustment specification for all of the layers of the batch, wherein the specification is a function of at least one thickness measurement performed on a layer of the batch. The method may also include defining a target thickness profile including a target value that designates a single target thickness to be achieved over the layer surface for each layer of the batch.

In this method, batches of layers may be treated together, wherein one layer thickness in the batch is adjusted by a certain given pitch while a subsequent layer thickness is being measured. The thickness profile may be measured by at least one of an ellipsometer or a reflectometer. The sacrificial oxidation may be implemented by utilizing at least one of a thermal oxidation technique or a rapid thermal oxidation technique. The method may include selectively oxidizing different locations of the layer during sacrificial oxidation, and may also include selectively powering a plurality of heater lamps situated to face different locations of the layer during sacrificial oxidation to locally adjust the temperature at which the layer is oxidized. The thin semiconductor material layer may be an upper layer of a multilayer structure, and the upper layer may be made of silicon. The multilayer structure may be an SOI structure.

In another aspect, the invention provides an apparatus for adjusting the thickness of a thin semiconductor material layer. The apparatus includes means for measuring the layer to establish a thickness profile, means for determining thickness adjustment specifications from the measured thickness profile, and means for conducting sacrificial oxidation for adjusting the thickness of the layer in accordance with the specifications.

The apparatus may also include one or more of the following features. The apparatus can include a processor unit operatively associated with the measuring means and the thickness adjustment means. The measuring means, the thickness adjustment means, and the processor unit are preferably integrated in the apparatus. The measuring means may be a reflectometer. The thickness adjustment means may be suitable for treating the thickness of the entire surface of at least one layer simultaneously in a selective manner. The thickness adjustment means may be adapted to adjust the thickness of one layer at a time. The thickness adjustment means may be a tube oven. The thickness adjustment means may enable the thickness of entire batches of layers to be adjusted at one time.

The method and apparatus advantageously increases the productivity of a facility that prepares thin layers. In particular, the technique eliminates the intermediate thickness inspection operations and can treat each layer in a single operation. Moreover, the method permits constraints associated with the layer fabrication step to be relaxed, thereby increasing yield and correspondingly reducing rejects. The quality of thin layers is also improved because thickness values are reached that are closer to the required specifications, and are reached without harming the crystal quality of the layer. The method can also be used to adjust layer thickness for layers presenting mean thicknesses of less than 1 $\mu$m, or thicknesses on the order of 0.1 $\mu$m, for example, or even on the order of 0.1 $\mu$m.

The present invention provides methods and apparatus that makes it possible to treat the entire surface of a layer simultaneously and portions thereof in a different manner. The method minimizes roughness of a layer, and obtains a roughness similar to that obtained with a polishing operation.

Other aspects and advantages of the invention will be apparent upon reading the following detailed description made with reference to the accompanying drawings.

BRIEF DESCRIPTION OF THE DRAWINGS

FIGS. 5a), 5b) and 5c) are diagrams showing the steps of sacrificial oxidizing of a thin layer on a substrate;

DETAILED DESCRIPTION OF THE PREFERRED EMBODIMENTS

The term "thin layer" as used herein means a layer of material presenting thickness that may lie in the range of a few angstroms to a few tens of micrometers. Such a thin layer is typically made of a semiconductor material such as silicon, and may have been processed using a SMART-CUT® method. Nevertheless, such a layer can also be obtained by a deposition technique (e.g. of polycrystalline silicon); or by an epitaxial growth technique (e.g. of monocrystalline silicon); or by a layer transfer technique other than the SMART-CUT® technique. In this respect, the transfer technique may in particular be a technique implementing creation of a zone of weakness in a substrate of semiconductor material, followed by detachment at the zone of weakness in order to make the layer.

Furthermore, the semiconductor material may be silicon. In which case the layer may correspond to an SOI surface layer, and the transfer technique, in addition to using a technique of the SMART-CUT® type, may include, for example, a technique of the ELTRAN® type or by some other type of transfer technique.

The material of the layer may be a material capable of being oxidized (e.g. of the silicon type, but other materials can be envisaged: for example SiC, SiGe, . . . ). This thin layer is advantageously secured to a support referred to as a "substrate" which serves to stiffen the assembly comprising the layer and the substrate (also known as a "wafer").

The substrate may advantageously be a semiconductor (e.g. silicon), or a stack of semiconductor layers, or may include non-homogenous components, or of components or of parts of components at more or less advanced stages of preparation.

FIG. 2 illustrates an example of the method of the invention for preparing thin layers implementing the main steps of the SMART-CUT® method. In this implementation, the thin layers are layers of silicon for SOI. However, the invention is applicable to preparing any type of thin layer, including layers, e.g. silicon layers, made by epitaxial growth (in particular monocrystalline silicon), or indeed by deposition (in particular polycrystalline silicon). The invention is not limited to a variant of a SMART-CUT® type method, but it applies to any type of method for preparing thin layers.

Again referring to FIG. 2, as compared with the scheme shown in FIG. 1, the thickness inspection steps 107 have been omitted, thus avoiding the resulting multiple losses and slowdowns of that scheme. As a result, it is also possible to relax the constraints associated with the various steps of fabricating layers, since a final thickness adjustment step is provided, as described below. Nevertheless, one or more intermediate inspection steps 107 could be retained in certain variants of the invention, depending on the specific needs of the method. In the context of the present technique, inspection of the layer thickness occurs during finishing (referenced 105' herein).

As shown in FIG. 2, finishing 105' includes a thickness adjustment step 1050', which itself comprises three operations applied to each layer. In particular, the operation 1051' of acquiring at least one measured thickness profile of the layer, the operation 1052' of deducing adjustment thickness specifications to be applied to the layer on the basis of the measured thickness profile acquired in 1051', and the operation 1053' of correcting layer thickness in accordance with the specifications.

The term "profile" is used to mean a representation of thickness characteristic of a layer. Such a profile may be a two-dimensional mesh covering the entire surface of the layer. Under such circumstances, a measured thickness profile of the layer includes making a series of measurements performed at the nodes of the mesh.

Nevertheless, it is possible to adapt the definition of a profile as a function of the capacity of the machines, in particular in terms of a desired level of detail and in terms of desired rates of throughput to be obtained. It is thus possible to define a "profile" in its simplest form as being a single measured point.

As mentioned below, the notion of "profile" relates not only to the measurements performed on the layers, but also to the thickness adjustment specifications which are transmitted to the thickness adjustment means for implementing the operation 1053'.

The thickness adjustment operation 1053' implements sacrificial oxidation, as described in greater detail below.

The thickness adjustment step 1050' may be followed by an additional finishing step 1054', e.g. implementing annealing under hydrogen.

FIG. 2 also shows a scrapping step 108 which may follow the operation 1052' of deducing specifications, in the event of the measured thickness profile of the layer as acquired in 1051' being unsuitable for enabling adequate adjustment to be applied to the layer in order to obtain a desired layer thickness profile at the outlet of the method.

Measurement Profile Acquisition

Again referring to FIG. 2, after creating thin layers during steps 101 to 104 (which are identical to those described with reference to FIG. 1), each thin layer is finished in step 105'. Step 1050' is performed initially. The step 1050' begins by an operation 1051' of acquiring at least one thickness measurement of a previously prepared layer, which may be accomplished by means of a reflectometer or by means of an ellipsometer. This acquisition of layer thickness measurements may be implemented by means of apparatus such as an Acumap™ reflectometer from the supplier ADE.

At the end of operation 1051', a thickness profile is available for each thin layer in the form of a map of the thickness of the layer. In the context of a batch fabrication, it is thus possible to measure the thickness of one layer in the batch while simultaneously applying the subsequent operation 1053' of thickness adjustment, as described below, to an earlier layer in the batch (either to the immediately preceding layer of the batch, or else to a layer preceding by some determined number of intervening layers). The measured profile is forwarded by the thickness measurement apparatus to a treatment unit which may also be connected to memory means suitable for storing the measured profiles of the layers.

In this respect, the apparatus for implementing the invention may include thickness measuring means, which may be an Acumap™ type machine; thickness adjustment means, described in greater detail below; and a processor unit associated with memory means (or "memory"). The processor unit is connected to the thickness measuring means (to receive therefrom measurements made on the layers), and to the thickness adjustment means (to forward thereto the thickness adjustment specifications).

The invention can be implemented in a fully automated manner in which the various above-mentioned means (thickness measuring means, thickness correcting means, processor unit) are connected to one another, and automatically exchange information. In such an implementation, the machine automatically determines the "recipes" to be applied as a function of the thickness measurements made on the layers (the concept of "recipes" is explained below).

It is also possible to implement the invention in a simplified manner in which the three means are not necessarily interconnected.

In a particularly simple implementation of the invention, the apparatus does not include a processor unit, but merely comprises thickness measuring means and thickness correcting means. In such a simplified implementation, an operator observes the thickness measurements made on the layers, which observations may be in real time, and issues the thickness adjustment commands to the thickness correcting means. The thickness adjustments for the application are deduced by the operator as a function of the observed thickness measurements.

Deducing Thickness Adjustment Specifications

Again referring to FIG. 2, the operation 1052' consists in deducing thickness adjustment specifications from the thickness measurement profile. This operation serves to transform the thickness measurements performed on each layer into commands applied to the thickness correcting means.

Figure 3:
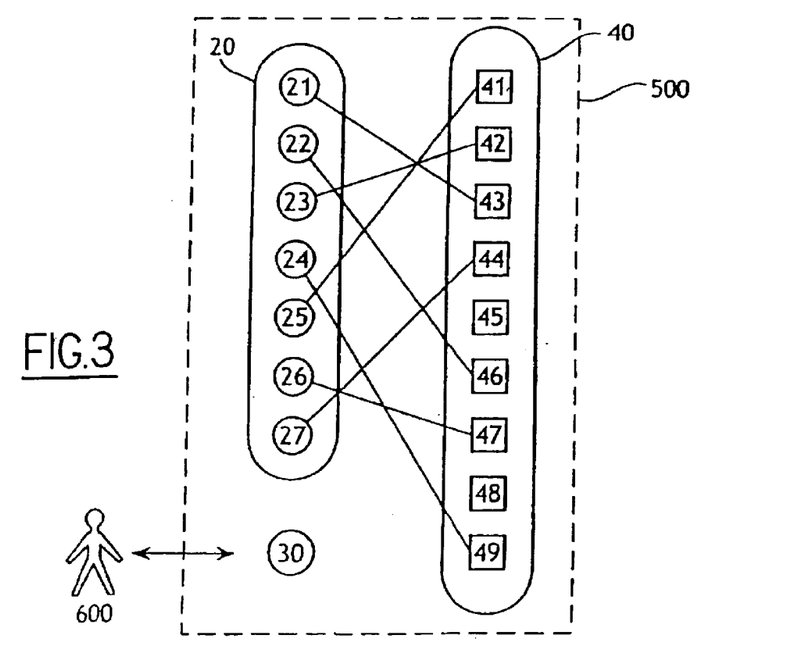
FIG. 3 is a diagram showing an example of associations established between two types of parameters which can be stored in order to implement the invention during the operation of deducing thickness adjustment specifications from the operation of measuring a thin layer.

FIG. 3 illustrates a reference memory means 500, which is used to deduce thickness adjustment specifications. A "library" 40 of typical thickness adjustment specifications 41 to 49 (referred to as "recipes" herein) may be stored in permanent manner in the memory means 500. Each recipe is a set of specifications to be delivered to the thickness correcting apparatus, which specifications are implemented during the operation 1053' in order to control the action of the apparatus.

Although the recipes are stored in permanent manner in the memory means 500, these recipes can nevertheless be varied over time. In particular, an operator can update the recipes in the memory 500 as often as necessary.

In this implementation, the operation 1052' thus includes selecting the most suitable recipe from amongst the recipes stored in the library 40. This selection can be performed in various ways. In one implementation, the selection is performed by using a list 20 of typical thickness profiles (21 to 27 in the example of FIG. 3).

As shown in FIG. 3, a correspondence is established between the typical thickness profiles and the recipes. In this implementation, each typical profile is associated with a single recipe.

The set of associations between typical profiles and recipes defines a "configuration" of the processor unit. For a given configuration, a plurality of typical profiles may be associated with a single recipe. The configuration made up of associations between typical profiles and recipes may also be stored in the memory 500.

The invention can be implemented in a fully automatic manner, and then the configuration can then be established automatically by a "configuration" algorithm which is loaded into the processor unit. More precisely, one of the data items input into the configuration algorithm is the target specification of the thickness profile (referred to as the "target" below) that has been established for layer fabrication. The target may be modified from time to time by an operator 600 using input means associated with the processor unit. The target may be stored in the memory 500 (where it is referenced 30).

In an implementation, when a target is changed, the configuration algorithm is automatically reactivated and establishes a new configuration defining correspondences between typical profiles in the list 20 and recipes in the library 40 (these typical profiles and recipes continue to be stored in permanent manner in the memory 500 and are not themselves affected by changes of target). For each new target, the configuration algorithm thus associates each typical thickness profile with a recipe that represents the most suitable thickness adjustment specifications for achieving the target when starting from a particular typical profile.

The "most suitable thickness adjustment specifications" thus cover the specifications which enable a layer to be obtained having a profile thickness that is as similar as possible to the profile represented by the target. This assumes that thickness adjustment is applied in accordance with the thickness adjustment specifications to a layer that presents a thickness profile corresponding to the typical profile.

The association by means of the configuration algorithm thus takes account not only of the target, but also of the typical profiles and of the recipes. New associations can also be stored in the memory 500.

It is possible to store a plurality of different configurations in the memory, each configuration possibly assigning a recipe to each typical thickness profile with an association that is different. In this case, means are provided to enable a user to select the desired configuration.

It should be observed that the target 30 and the typical profiles in the list 20 are parameters representing similar magnitudes, i.e. a thickness profile described using a determined mesh covering the surface of the thin layer. The term "thickness profile" is used to mean a series of thickness values for the layer, taken at determined points of the layer. As mentioned above, these points are distributed in a mesh which is preferably two-dimensional, but could possibly be one-dimensional or even a single point of the surface of the layer. The mesh thus serves as the basis for the following profiles:

those measured during the operation 1051';
the typical profiles stored in the list 20; and
the stored target profile 30.

Nevertheless, it should be understood that, in a variant of the invention, provision can be made for all three categories of profile to be stored and used with different levels of detail. For example, thickness measurements can be obtained using a very detailed mesh, and used on a target which is defined on a sub-mesh that is less detailed, for example it is typically possible to have a target of a single thickness value for the entire layer.

It is also possible to make provision for the three categories of profile to be defined using meshes that are completely uncorrelated relative to one another. In particular, the mesh defining the measured profile and the mesh defining the adjustment profile need not be correlated, and may be defined independently of each other.

In an implementation, these three categories of profile are stored and used with the same level of detail in the apparatus. It will thus be understood that at any given time, the memory 500 stores the following:

"permanent" information which can nevertheless be updated, which may include both the list 20 of typical profiles, and the library 40 of recipes;

together with a target 30 and at least one configuration, with only one such configuration being selected at any one time.

Figure 4:
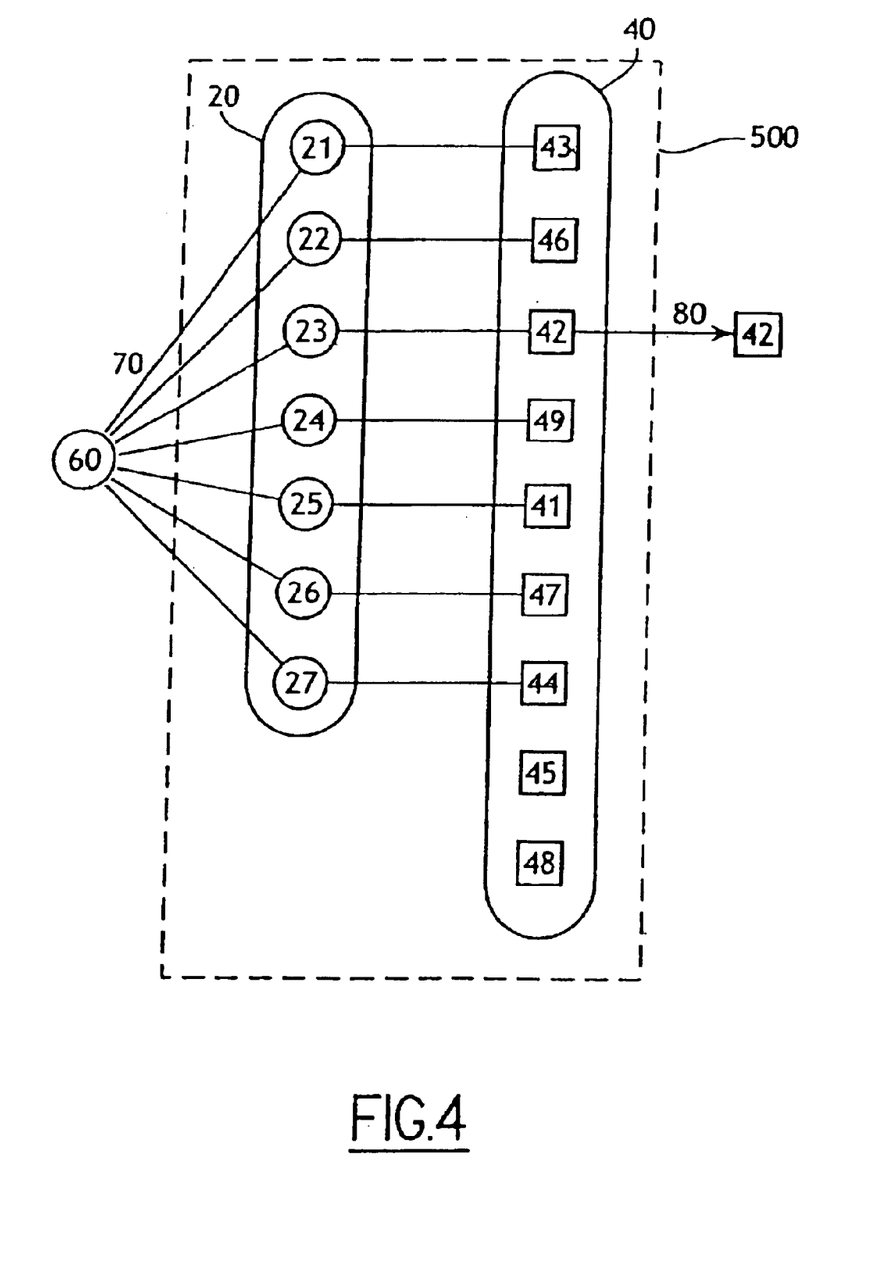
FIG. 4 is a diagram showing the use which is made of the association mentioned above with reference to FIG. 3.
Figure 5:
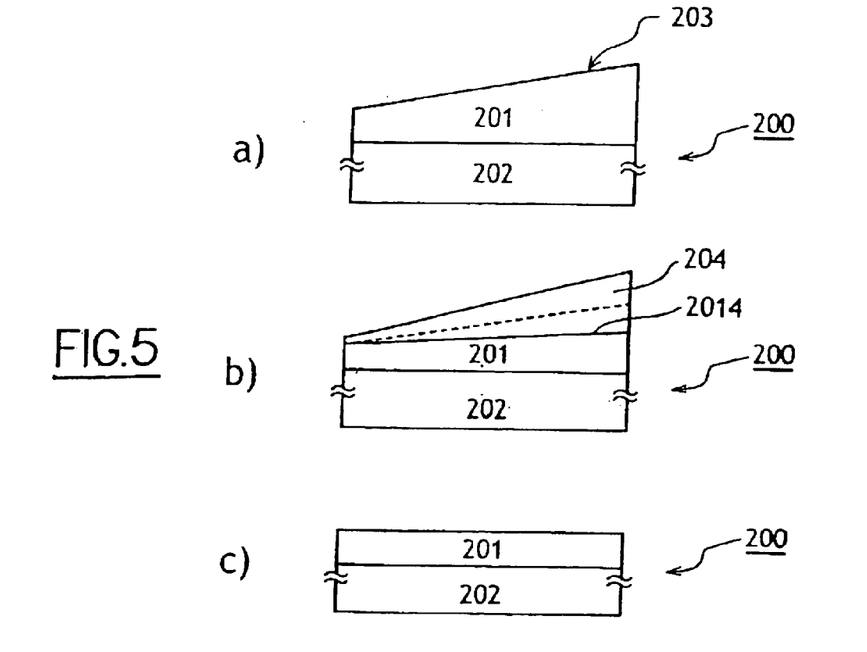

FIG. 4 shows an example configuration that may be used to implement the operation 1052'. On the basis of a thin layer 201 that is to be finalized (see FIG. 5) it is desired to obtain a finished thin layer having a thickness profile that is as similar as possible to the target profile 30 stored in the memory 500. This may be accomplished by applying thickness adjustment 1053' using the recipe selected at 1052' following the measurements performed at 1051' on the thickness of the thin layer.

Returning to operation 1052' of deducing the recipe, this operation may be performed on two levels. The first level corresponds to the above-described algorithm, i.e. configuring the apparatus by defining associations between typical profiles and recipes for a given target. The configuration algorithm is executed each time there is a change of target (e.g. in order to process a batch of thin layers in some specific manner), in an implementation of the invention that is fully automated. Even in a fully automated implementation, it is specified that an option can be made available to an operator to update the configuration stored in the apparatus. Thus, the operator can establish any desired configuration by defining specific associations between typical thickness profiles and recipes in order to load the configuration into the memory of the machine and put it into operation.

For example, the configuration algorithm may perform the following tasks:

for each typical profile, evaluate the thickness value differences between the typical profile and the target profile 30. These thickness differences then correspond to the thickness adjustments that need to be implemented on the typical profile in order to obtain a profile similar to that of the target 30; and for each typical profile, deduce the most suitable recipe for implementing the previously-evaluated thickness adjustments.

Each typical profile (21 to 27) is then associated with a recipe (41 to 49). In the purely illustrative example of FIG. 4, the following associations are deduced: 21 & 43; 22 & 46; 23 & 42; 24 & 49; 25 & 41; 26 & 47; and 27 & 44.

As mentioned above, a user 600 can modify parameters stored in the memory 500, such as the target profile 30, the typical profiles (21 to 27), and/or the recipes (41 to 49). Modifications may be made by means of a user/memory interface (such as a keyboard and a screen). Such changes can be additions, deletions, and/or transformations of or to parameters.

After such a modification, the user may trigger a reconfiguration of the apparatus. That is, the configuration algorithm may execute in order to establish new associations.

The second level of the operation 1052', as shown in FIG. 4 relates to selecting the recipe (41 to 49) as a function of a stored target 30 and of a measurement profile 60 obtained at 1051' from a thin layer 201. This second level of operation occurs only once the apparatus has been configured as explained above.

Recipe deduction takes place in two steps:

a selection step 70 of selecting a typical profile that is the most similar to the measured profile 60 from amongst the typical profiles stored in the list 20. This can be done after evaluating thickness value differences between the measured profile 60 and each of the typical profiles using a given mesh (e.g. the mesh defining the typical profiles, or a sub-mesh of that mesh); and deducing at 80 the recipe 41 to 49 which is associated with the typical profiles 21 to 27, by virtue of the associations supplied by the selected configuration (in this respect, it is specified that the processor unit is connected to the various fields of the memory 500).

In this example, the typical profile most similar to the measured profile 60 is referenced 23, and the associated recipe is thus the recipe referenced 42. The recipe 42 that is deduced in this way comprises parameters suitable for controlling thickness adjustment in a manner that corresponds to the measured profile 60.

In order to obtain as close as possible a fit for the thicknesses that are obtained by applying the selected recipes, it is possible to increase the number of typical profiles in the list 20 and the number of recipes in the list 40. It is also possible to adapt the lists of typical profiles and of recipes that are used for selecting the recipe based on thickness measurements, e.g. for certain batches of thin layers.

In another implementation of the invention, the list of typical profiles 20 and/or the list of recipes 40 are thus classified in a particular manner, e.g. in a tree structure defining categories and sub-categories (with some desired number of levels). It is thus possible to group together typical profiles in categories of similar profiles, for example, by using a tree structure of categories, sub-categories, etc. in which the leaves (deepest levels) include lists 20 of typical profiles. For example, it is possible to define a category on the basis of very general characteristics of a typical profile, and to make use of characteristics that are more and more detailed when defining groups at deeper levels within the tree structure.

Under such circumstances, and still using the interface of the apparatus, it is possible to select zones of the tree structure of typical profiles in which to search in order to make the selection 70. This makes it possible to avoid trying to compare layers in a certain batch with typical profiles that do not have the same general characteristics, and to search only amongst categories containing typical profiles similar to the profiles expected of the measured layers. Thus, selection 70 is performed in as many steps as the tree structure has levels. For example, an initial selection step selects a high level category in the tree structure, and each following step selects a sub-category, a sub-sub-category, etc. The process goes down one level of the tree structure each time until the appropriate list of typical profiles is selected, until finally the most suitable typical profile is selected.

Consequently, a single configuration is selected for each list of typical profiles that might need to be searched for selecting a typical profile. Once the typical profile has been selected, it is the configuration of the list that contains the typical profile that is used for deducing a recipe. Selection in successive steps makes it possible to classify the measured profile 60 in successive categories that are of increasing detail and accuracy, in terms of thickness specification. This provides the advantage of increasing effectiveness and speed during the step of determining which stored typical profile is the most similar to the measured profile 60.

Other variants can also exist and relate to the operation 1052' functioning in the same manner, not at the second level, but at the first level. It is thus possible to subdivide all of the typical profiles into a plurality of lists 20 ordered in a typical profile tree structure and/or to order all of the recipes in a plurality of lists 40 likewise organized in a recipe tree structure in order to implement the configuration algorithm. Thus, in order to establish a configuration, the configuration algorithm that searches for a recipe to be associated with a typical profile does not search through all of the recipes, but begins by selecting categories of recipes as a function of the thickness differences between the target and the typical profile (i.e. by selecting a category of recipes that corresponds best to said differences). In this case also, the tree structure of recipes is defined by levels of increasingly fine detail on going deeper into the tree structure (i.e. for example, by defining high level categories using a few thickness adjustment parameters and terminating at the bottom of the tree structure with a more complete definition for the recipe).

It is also possible for configuration purposes to establish a link between a given level of a tree structure of typical profiles ("starting level") and a level in the recipe tree structure ("arrival level"). In this case, for each typical profile associated with a given category of the starting level, there exists a recipe arrival level category.

During configuration, any search for a recipe for a typical profile of the starting level is directed automatically towards the arrival level category (searching then continuing down the tree structure of recipes). It is also possible during configuration to associate a list 20 of typical profiles with the same recipe, or with the same list 40 of recipes, or more generally with the same group of recipes at some particular level of the recipe tree structure. The same can be done for any list 20 of typical profiles, or more generally for any group at some particular level in the tree structure of typical profiles.

It is also possible to define a tree structure of recipes not in terms of successive levels of detail, but in terms of recipe parameters. Thus, for example, it is possible to define:

a first top level category in the tree structure of recipes, with the recipes in this first top level category defining a thickness adjustment specification that is uniform over the entire surface of the layer; and other high level categories depending on overall parameters of the distribution of thickness adjustment specifications over the surface. For example, it is possible to define greater (or on the contrary smaller) thickness reduction in a central region of the layer, and greater (or on the contrary smaller) reduction of thickness in a given angular sector of the layer, and the like.

Thus, while selecting the recipe to be applied to a layer whose thickness has been measured, it is possible to navigate in the tree structure of recipes as a function of the main characteristics of the thickness map as measured for the layer. For example, when a layer has a concave thickness profile, the system will automatically associate a profile thickness profile that is concave corresponding to the measured layer. Continuing this example, if the thickness target is a "flat" target, i.e. corresponding to constant thickness over the entire layer, it is then appropriate to apply a recipe for correcting the observed concave shape. In such a case, the configuration algorithm makes it possible to select a recipe from the library which searches for a high level category corresponding to "convex" or "bulging" recipes. This example thus corresponds to thickness adjustment seeking to obtain uniform thickness within a layer.

The above-mentioned considerations relating to establishing links between typical profiles and recipes remain applicable, regardless of the tree structure implemented.

In all circumstances, the two above-described levels, configuration and selecting a recipe for each measured layer, correspond to operation 1052'.

In another implementation, the operation 1052' of deducing a recipe is performed by apparatus that has electronic components suitable for storing and executing at least one logic program. The apparatus is suitable for implementing at least a portion of the deduction operation. For example, this can be done by executing binary programs on a computer. Of course, the operation 1052' of deducing thickness adjustment specifications may also be implemented in manners other than that described above.

Thus, it is possible to implement any means for preparing adjustment specifications starting from a stored target and an acquired measurement profile.

In a particularly simple implementation, it is thus possible for each thin layer whose thickness has been measured to cause specifications to be calculated as deduced directly from the thickness differences between the target profile and the measured profile.

In a simplified implementation, and as mentioned above, it is also possible for thickness adjustment specifications to be deduced by an operator, as a function of the observed thickness measurements. In this case, after the operator has deduced the thickness adjustment specifications that need to be applied to a layer that has just been measured, the operator informs the thickness adjustment means of the specifications. It is also possible for the operator to provide information concerning thickness adjustment specifications only in the event of a change of target, assuming that the layers in a given batch, or even the layers in a plurality of consecutive batches, have previously been subjected to fabrication steps under similar conditions and are required at the end of the process to comply with the same thickness target. For example, a target having an average thickness value, which implies that thickness should be as constant as possible over the layer.

Thickness Adjustment

The operation 1053' comprises at least one operation of correcting the thickness of the layer in accordance with the thickness adjustment specifications as previously deduced in 1052'.

In an implementation, for thickness adjustment the layer is treated by using sacrificial oxidation treatment. Thus, it is possible to treat the thickness of a layer by sacrificial oxidation, by forming an oxide layer on the surface of the layer, optionally annealing, and then a deoxidating.

FIGS. 5a) to 5c) show a wafer 200 comprising a thin semiconductor layer 201 on a supporting substrate 202 undergoing sacrificial oxidation to selectively reduce the thickness of the superficial zone 203 at the surface of the layer, where the zone presents too great a lack of uniformity in layer thickness. The term "selectively" is used to cover the characteristic whereby oxidation is attacked in a different manner in different regions of the surface of the zone 203. More precisely, the term "selectively" does not correspond to "binary" treatment in which certain regions of the layer are either totally oxidized or not oxidized at all, rather the idea is to ensure that the amount of oxidation is deliberately varied locally depending on the location on the layer in question. By implementing a sacrificial oxidation technique, it is possible to vary the modifications in thickness at different locations of the surface of the layer.

A corresponding advantage is that as a result it is possible to treat different regions of a layer selectively in order to apply different thickness adjustments to those regions, and to do so in a simultaneous operation. This advantage clearly distinguishes the present methods over techniques of the PACE or Epion type mentioned in the introduction of the present application, since those techniques require certain elements of the apparatus to be displaced sequentially (displacement of the layer itself and/or of a mask), in order to obtain such selective thickness adjustment at different locations on the surface of a layer.

The effect of the sacrificial oxidation technique is shown in FIGS. 5a to 5c. In particular, FIG. 5a shows a semiconductor layer 201 (e.g. made of silicon) on a substrate 202. The layer 201 has a superficial region 203 which defines a thickness that is not uniform (in the simplified example of FIG. 5a, the surface of the region 203 presents a slope which is drawn in exaggerated manner). With reference to FIG. 5b, the layer 201 is oxidized by heat treatment so as to form an oxide layer 204. This oxide layer 204 develops in the vicinity of the surface of the layer 201 in the zone 203 (whose boundary is represented by dashed lines in FIG. 5b). During the heat treatment, the interface between the oxide and the silicon moves downwards through the silicon, defining a boundary 2014 between the superficial oxide layer and the layer of silicon 201, and the slope of the boundary 2014 becomes closer to a slope parallel to the general slope of the interface between the layer 201 and the substrate 202. The position of the boundary 2014 is thus defined by the local intensity of sacrificial oxidation. Since the intensity of sacrificial oxidation is controlled locally (as explained in greater detail below), the position of the boundary 2014 is consequently controlled locally at all points in the layer.

For the simplified situation shown in FIG. 5b, it can be considered to a first approximation that the boundary 2014 has a position that is substantially symmetrical to the position of the surface of the oxide layer being created, relative to the position of the surface of the region 203 (which region has become "absorbed" into the oxide layer 204).

In a variant described in U.S. Pat. No. 6,403,450 (see in particular example 2), an additional step of annealing the substrate is added to enable the layer 201 to be cured of surface irregularities generated during oxidation and during the preceding steps in the method of preparing the thin layer. As explained in U.S. Pat. No. 6,403,450, it is possible in particular to treat structures of the SOI type.

Referring to FIG. 5c, a deoxidation step follows the annealing. During this step, the oxide layer 204 is generally chemically consumed. By way of example, in order to remove a thickness of $SiO_2$ of the order of 50 Å to 200 Å, the wafer 200 may be dipped in a bath of 10% or 20% hydrofluoric acid for about 5 s to 30 s. In the end, a thin layer 201 is obtained (FIG. 5c), of thickness that is more uniform (and smaller) than the thickness of the initial thin layer 201 of FIG. 5a.

The above-described sacrificial oxidation method is merely a variant of the methods described in document FR 2 777 115. The present methods are not limited to this particular variant and extend to all other sacrificial oxidation methods.

The main parameters of oxidation heat treatment techniques are temperature, duration of oxidation, and the partial pressure of oxygen in the oxidation atmosphere. These parameters can be well controlled, thus giving good reproducibility to this application of the method.

The method is also flexible in use and compatible with all of the usual procedures for treating thin layers or wafers in the fabrication of microelectronic components.

FIGS. 6 to 10 show a particular treatment of the thin layer by sacrificial oxidation using an RTO technique.

Figure 6:
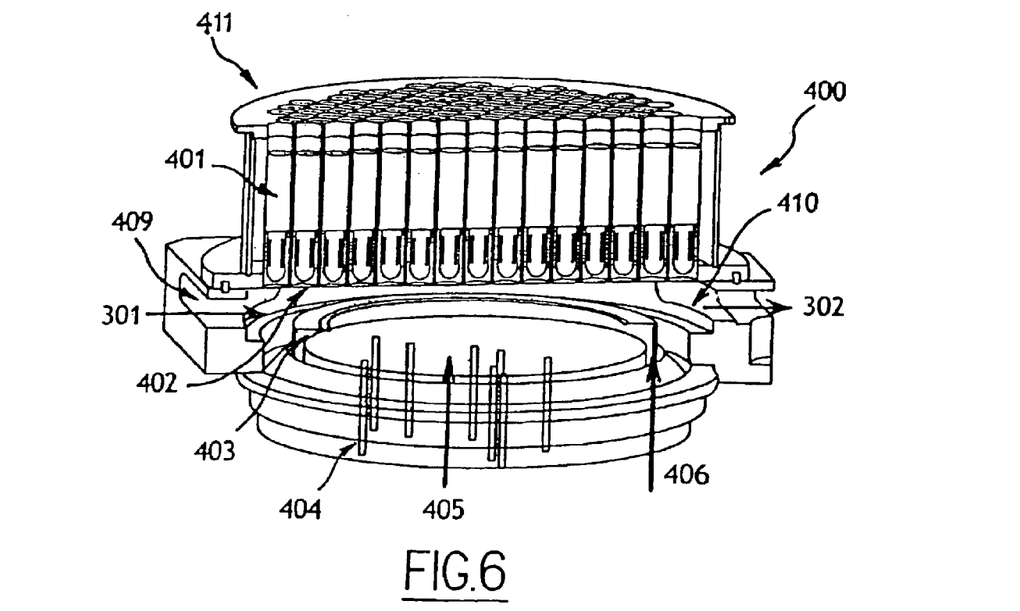
FIG. 6 is a perspective view of a rapid thermal oxidation (RTO) device configured to operate according to the invention for correcting thickness.

The apparatus for treating thin layers by sacrificial oxidation on which the description below is based is an RTP XE Centura apparatus from the supplier Applied Materials®. Such apparatus comprises in particular an oxidation chamber 400 suitable for containing at least one semiconductor thin layer or wafer carrying a semiconductor thin layer. The thin layer or the wafer is supported inside the oxidation chamber on a flat annular turntable 403, which is generally made of silicon carbide. A heating system is located above the thin layer, the heating system comprising a plurality of lamps 401, each generally being placed inside a lightweight tube, and the lamps 401 may be of the halogen type. The lamps 401 are advantageously disposed in such a manner as to cover the entire surface of the thin layer.

Because of the large amount of heat given off by the heating system (about 1000° C.), a cooling circuit 411 may be installed in the wall of the oxidation chamber 400 in order to remove the heat and thus avoid possible burning of the outside walls of the chamber 400.

Figure 7:
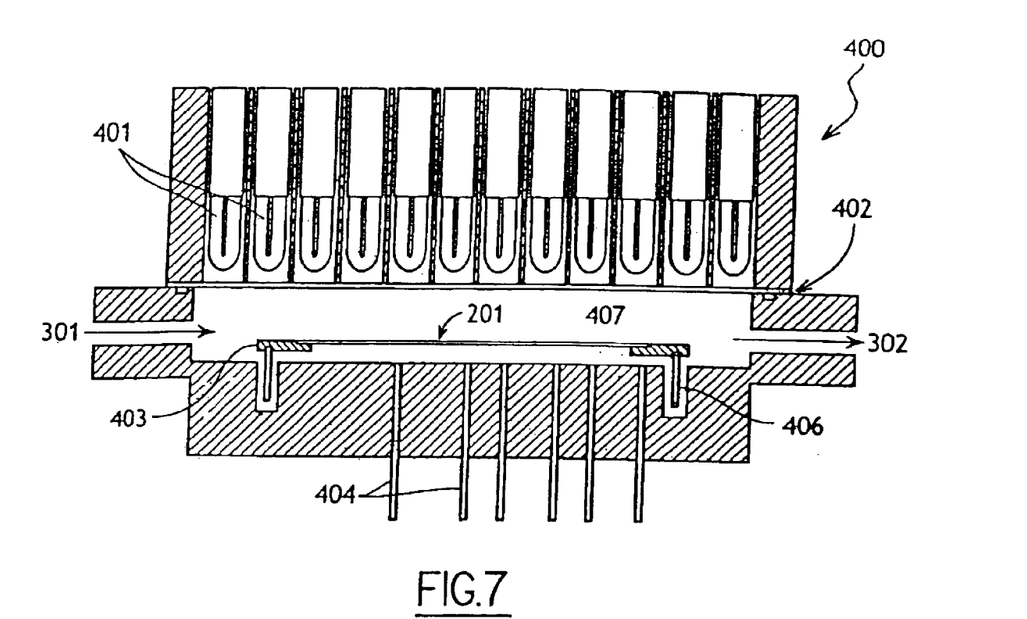
FIG. 7 is a diagrammatic cross-section view of a thermal oxidation chamber of an RTO device, at atmospheric pressure.
Figure 8:
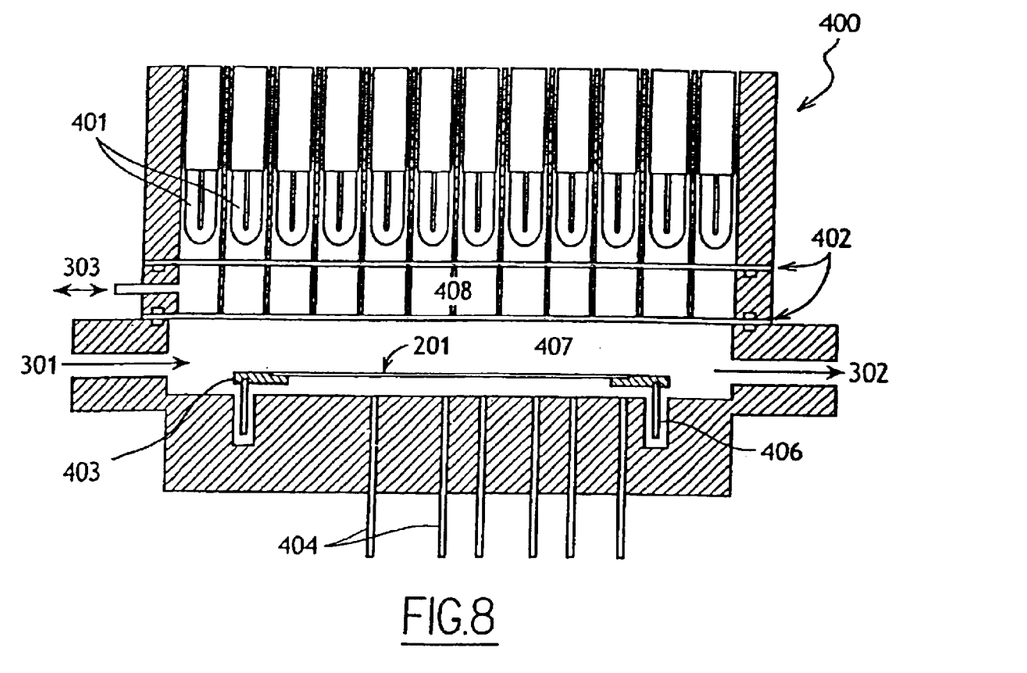
FIG. 8 is a diagrammatic cross-section view of a thermal oxidation chamber of an RTO device at low pressure.

A fine window 402, generally made of quartz, separates the chamber lamps 401 from the oxidizing gas in the gas chamber 407, the gas chamber being an empty space situated above the thin layer (see FIG. 7 and FIG. 8).

At least two openings 409 and 410, generally facing openings, are formed through the wall of the oxidation chamber 400 leading to the gas chamber 407. Each opening is suitable for being hermetically connected to a pumping system so as to enable oxidizing gas to enter 301 and leave 302 the gas chamber 407. A cylinder 406, which is preferably hollow and made of quartz, is situated beneath the support 403 and secured thereto, and is suitable for imparting rotation about the axis of the cylinder relative to the oxidation chamber 400. The cylinder 406 enables the thin layer to be turned beneath the lamps 401, so as to obtain heat treatment that is as uniform as possible. Thus, heat is applied to the entire layer and overcomes any ill effects that could result from non-uniform local heating. This is particularly advantageous when it is desirable to apply a uniform recipe over the entire surface of the layer.

In general, the configuration with a support 403 that can be set into rotation is well adapted to situations in which thickness is to be corrected symmetrically about the axis of rotation of the support. This can be desirable in particular when treating batches of layers that have previously been subjected to preparation and treatment steps that themselves have the effect of modifying the properties of the layer in a manner that is symmetrical. Nevertheless, in a variant, it is also possible to use a support 403 that is stationary.

A temperature measuring system is also installed in the chamber, generally being placed beneath the thin layer and/or the wafer. The temperature measuring system preferably comprises a reflecting tray 405 suitable for amplifying the thermal radiation information so that sensors 404 can pick up the temperature information and transmit it to a control unit connected to the processor unit. The sensors 404 are placed so as to measure the temperature profile of the oxidizing gas in the vicinity of the surface of the thin layer. The sensors 404 may be optical fibers, and they are thus designed to transmit optical information in the form of heat rays taken from close to the reflecting tray 405 to a control unit.

Figure 12:
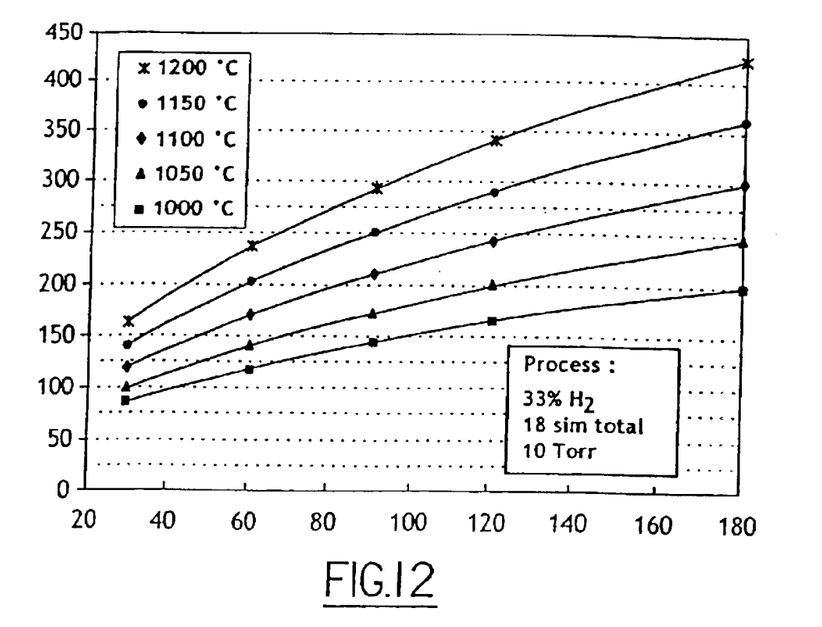
FIG. 12 shows how the thicknesses of silicon oxide layers formed by RTO at different oxidation temperatures increase over time when oxidation is performed at a pressure of 10 torr and at a concentration of $H_2$ set at 33% of the oxidizing gas.

With reference to FIG. 7, the gas enters via gas inlet 301 and spends a predetermined duration in the gas chamber 407 where it is raised to a reference temperature. Gas is exhausted out of gas outlet 302. As mentioned above, once the nature of the gas, the oxygen concentration in the atmosphere, and the pressure have been set, it is the parameters of duration and temperature that act in real time to determine the mean thickness of oxide formed in a thin layer 201, as shown in FIG. 12. The chart of FIG. 12 plots increasing thickness (the ordinate axis) of thin layers for different durations of oxidation (along the abscissa axis), and it does so for different oxidation temperatures which correspond to the different curves. The higher the oxidation temperature, the greater the mean thickness of the oxide layer, for given oxidation duration set at a particular value. The longer the duration of oxidation, the greater the mean thickness of the oxide layer, for given temperature fixed at a certain value.

Figure 9:
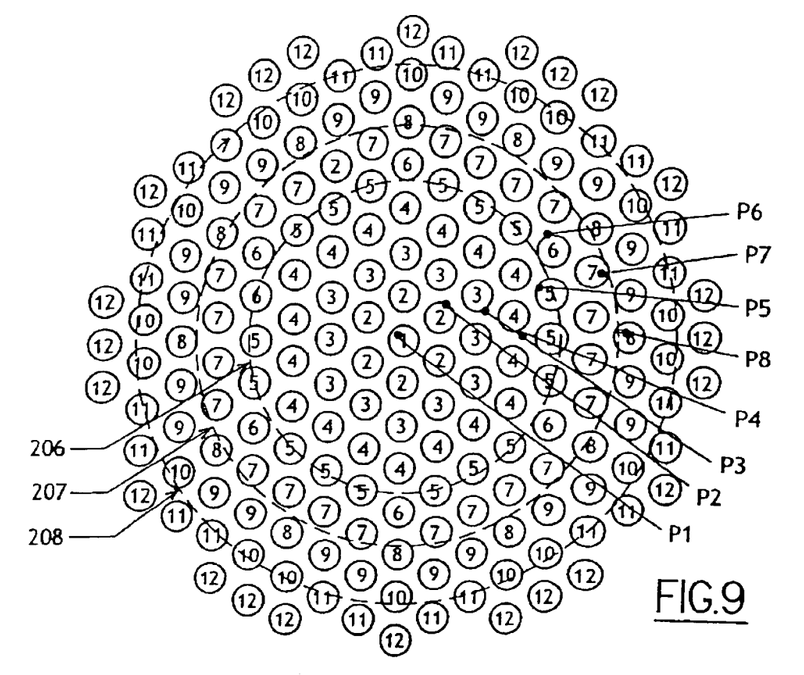
FIG. 9 is a diagram showing how the lamps and probes surrounding thin layers that can be of different diameters may be distributed within an RTO device.

Temperature may be controlled by regulating the power supply to the individual lamps 401, alone or in a group or groups. Individualized electrical power supply adjustment to each lamp thus makes it possible to establish a temperature profile that differs and that is predetermined over the entire surface of the thin layer. Such operation is shown in FIG. 9 for three types of thin layer size referenced 206, 207, and 208, each type being in the form of a disk. In the particular example shown, the lamps are organized in twelve categories numbered 1 to 12 going from lamps overlying the central zone towards lamps overlying the peripheral zones of the layers 206, 207, and 208. In this example, each lamp number corresponds to a lamp temperature. The number of lamp categories can be adapted as a function of needs. Thus, the number can be increased if it is desired to distinguish the thickness adjustment applied to different locations of the layer more finely.

The temperature obtained at a point on the surface of the layer depends firstly on the lamp which is closest thereto, but also on adjacent lamps. Consequently, the central zone of the layer will be hotter than its peripheral zone in the event of all of the lamps being powered uniformly (i.e. if all lamp numbers are the same).

If uniform temperature (and thus uniform oxidation) is desired over the entire surface of the layer 206, 207, or 208, then the central lamps are powered in such a manner as to cause them to be at a lower temperature than the peripheral lamps. In contrast, if it is desired to obtain temperature differences (and thus oxidation differences) over the surface of the layer 206, 207, or 208, it suffices to adapt the power supply to each lamp in such a manner as to obtain the desired temperature profile.

The amount of power delivered selectively to each lamp stems directly from the commands that correspond to the selected recipe, which commands are forwarded to the thickness adjustment apparatus by the processor unit. The thickness adjustment apparatus can be calibrated in such a manner that the recipes (as prepared automatically by the processor unit or merely by an operator) whose characteristics are forwarded in the form of commands to the thickness adjustment apparatus, do actually produce the desired effect in terms of thickness adjustment. Such calibration can be implemented by observing the reference effects of thickness adjustment (recipes) on the surfaces of layers. The thickness adjustment operation can even be followed by a final step of measuring layer thickness in order to detect any drift in thickness adjustment relative to the specified recipe. Under such circumstances, it is possible to provide a regulation loop for the thickness adjustment apparatus to adapt the power supply of different categories of lamp so as to remedy any such drift almost in real time.

The main parameters characterizing sacrificial oxidation can be tracked and taken into account by the processor unit controlling the adjustment apparatus. For these purposes, the processor unit is connected to various sensors serving to characterize how sacrificial oxidation operations are running (in particular time and various temperature probes).

Temperature adjustment operations can be facilitated by making temperature measurements using the sensors 404, which in FIG. 9 are given references P1, P2, P3, P4, P5, P6, P7, and P8 that are located in the vicinity of the layer.

The duration of sacrificial oxidation is also defined in the commands forwarded by the processor unit to the thickness adjustment apparatus once a recipe has been selected. This duration of oxidation is determined in particular by means of pre-established reference values from a list of previously-made measurements stored in the processor unit. These previously-made measurements may include the following:

known machine sequence duration measurements (for example the time duration between the gas inlet time 301 and the gas outlet time 302, or the duration between the time the thin layer enters the oxidation chamber and the time it leaves it, or the duration between the time when heating is started and the time when it ends, etc.); and oxide thickness measurements for a certain number of layers that are post-oxidized under predetermined oxidation conditions.

On the basis of comparisons of those two types of measurement, and on the basis of the selected recipe, the processor unit deduces reference values for determining the duration of oxidation for layers prepared under the same predetermined oxidation conditions.

It should be added that the main parameters influencing oxidation duration (control of the chemical composition of the oxidizing gas during oxidation, temperature control, pressure control, etc.) are themselves likewise controlled.

In this respect, a variant of the apparatus shown in FIG. 8 shows additional means for controlling gas pressure in the chamber 407.

The diagram of FIG. 8 shows an oxidation chamber 400 including an additional pressurizing chamber 408 connected to at least one vacuum pump and enabling reduced pressure to be established inside the gas chamber 407. For reduced pressures, this enables layer oxidation speed to be influenced, and thus makes it possible to achieve better control over layer thickness. The pressures used are typically greater than a few torr, and thus values greater than 0.01 atmospheres.

The vacuums thus used are much softer than those required by prior procedures seeking to achieve the same objects as for the present invention. This softer vacuum correspondingly reduces constraints on the means needed to implement the method (pumping means, sealing means, monitoring means). Nevertheless, thermal oxidation can also be implemented under atmospheric pressure, or even at higher pressure.

Concerning the chemical composition parameter of the oxidizing gas, it is the usual practice prior to admitting any gas 301 to have an atmosphere that has been made as inert as possible and as non-oxidizing as possible, e.g. using an inert gas or hydrogen.

A surface oxide layer can generally be formed by a dry technique or by a wet technique. In the dry technique, the surface oxide layer is formed under gaseous oxygen. In the wet technique, the surface oxide layer is formed by using steam. For the wet technique, a preferred technique relates to an inlet gas mixture 301 including $O_2$ and hydrogen.

Figure 14:
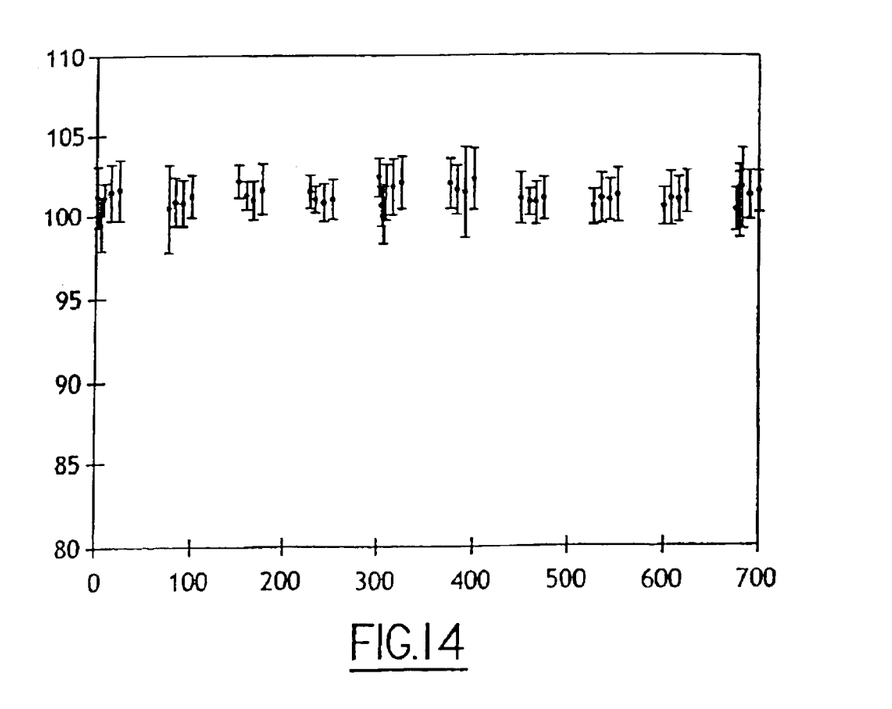
FIG. 14 shows silicon oxide thicknesses, and the associated tolerances as formed by RTO on 700 thin layers, under dry oxidation at 110° C. and in a time of 60 seconds.

In practice, all of these parameters (temperature, duration, pressure, gas composition) are controlled, thus making it possible to achieve reliable reproducibility of oxidation for variations in oxide thickness that can oscillate around 10 Å, as shown for example by FIG. 14. In FIG. 14, oxide thickness is plotted up the ordinate axis and is compared for 700 layers (plotted along the abscissa axis) prepared under the same preparation conditions.

These parameters are also easy to adjust, making such a method much more flexible in use and much more uniform than the usual set of procedures implemented for treating thin layers and/or wafers when fabricating microelectronic components.

Figure 10:
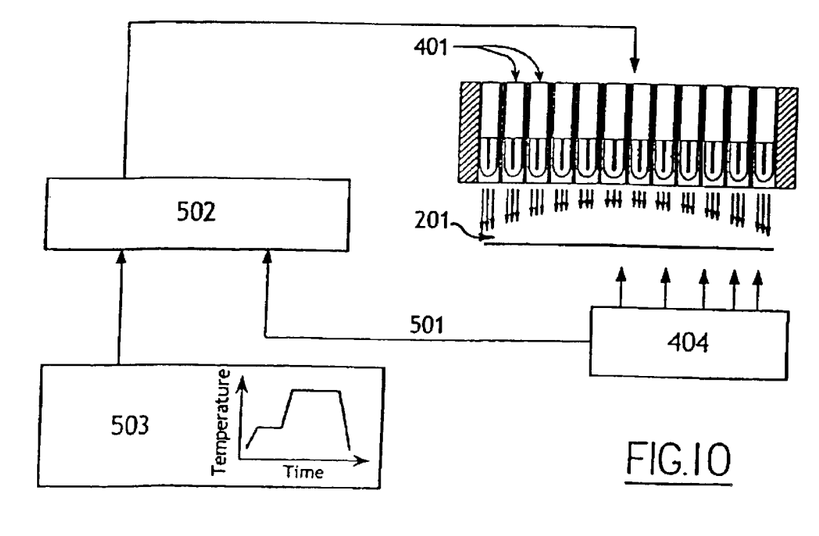
FIG. 10 is a block diagram showing how an RTO device operates.
Figure 11:
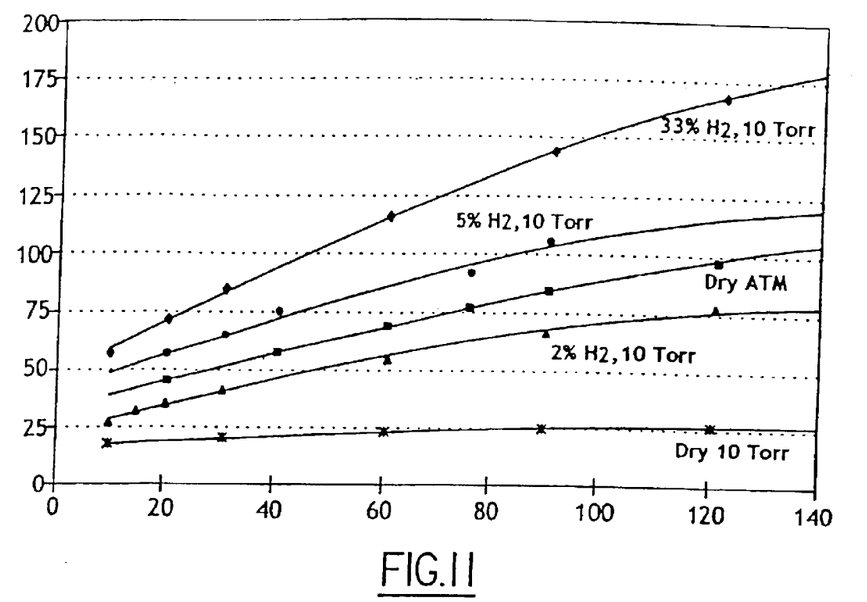
FIG. 11 is a graph showing how the thicknesses of silicon oxide layers formed by RTO increase over time for different concentrations of $H_2$ in the oxidizing gas at low pressures and with an oxidation temperature set at 1050° C.

FIG. 10 shows a method of operating a rapid thermal oxidation chamber. In the most complete version of the apparatus of the invention (including in particular a processor unit), the hardware means mentioned for rapid thermal oxidation are connected to the processor unit and are controlled thereby. A thickness control unit 502 adjusts a pre-established time/temperature profile 503 as a function of temperature measurements 501 received from sensors 404 level with a thin layer 201, and control unit 502 powers the lamps 401 to comply with the selected profile 503. Such apparatus thus provides accurate and easy control over the oxidation process, and thus over the thickness values of the layer 201.

The control unit 502 can also advantageously take account of specifications for gas composition parameters, pressure in the gas chamber, gas admission, rate of throughput of layers inside the chamber, and the like.

As a result, implementing sacrificial oxidation whereby a thickness is removed from the layer takes place more quickly than with prior art techniques, given that this sacrificial oxidation technique is performed simultaneously over the entire layer (and is not performed locally).

Variants of such apparatus relate to oxidation chambers suitable for containing a plurality of thin layers, or to associations of a plurality of oxidation chambers for the purpose of further increasing the throughput rate of layers in the facility for preparing them.

The thickness adjustment apparatus used for implementing the present invention is not restricted to the rapid thermal oxidation apparatus 400 described above, but covers any other thermal oxidation apparatus.

In general, the present method can be implemented by any method using sacrificial oxidation to correct thickness.

In general, the sacrificial oxidation technique achieves adjustment accuracy that is much better than that which can be envisaged with known techniques.

An application of the present method consists in uniform removal of matter from the surface of the layer over a depth which can be as much as several hundreds of angstroms. This is achieved by selecting a recipe having a single thickness adjustment value, enabling the thickness of the layer that is to be corrected to be reduced in uniform manner. In this case, the oxidation apparatus adjusts the temperature within the oxidation chamber, in particular by acting on the electrical power supply to the lamps 401 and on the duration of oxidation so as to obtain a uniform temperature over the entire surface of the layer, and thus obtain uniform oxidation.

Another application consists in removing material in a manner that differs selectively over the surface of the layer, for example in order to adjust uniformity within a layer.

In the particular circumstance where an attempt is thus made to achieve uniform thickness throughout the layer, it can be necessary to compensate for certain uneven zones, such as convex or concave cylindrical symmetry that appears during layer preparation, or slopes going to "left" or to "right", etc. Differential removal of material can be implemented by a sacrificial oxidation method, in particular by locally establishing a specific oxidation temperature over the surface of the layer, and thus establishing specific local oxide thicknesses, by selecting an appropriate recipe which causes corresponding commands to be delivered to the sacrificial oxidation apparatus.

Referring to the oxidation chamber 400, such a command will cause the lamps 401 to be powered selectively in such a manner as to achieve the desired adjustments in the selected zones.

It is also possible to combine recipes when treating a single layer.

Thus, in particular, it is possible to implement a adjustment (e.g. a large adjustment) of thickness in uniform manner over the layer, and then to implement a finer differential adjustment for compensating for local non-uniformities of thickness, such local compensation being implemented by differential sacrificial oxidation.

By this method of preparing a layer that includes thickness adjustment operations, the treatment of the layer by sacrificial oxidation is adapted to present thicknesses of thin layers.

The oxidation temperature and time parameters are easily adjustable and can define the quantity of material to be removed. This makes it possible to control the technique in such a manner as to obtain a quantity of removed material that can vary in a controlled manner over the range a few tens of angstroms to a few thousands of angstroms, without leading to significant crystal defects, thereby leading to applications on layers that are very thin. In practice, these points make it possible to apply the method of the present invention to semiconductor thin layers having a mean thickness well below 1 $\mu$m.

Another aspect of the invention lies in the fact that thin layers are generally prepared in batches. In this aspect of the invention, a single target thickness profile is defined for all of the layers in a batch (i.e. the "target" 30 is common to all of the layers in the batch). The respective thickness adjustment specifications for each layer in the batch are then individualized in such a manner that each layer of the batch, after thickness adjustment has been performed, presents a final layer thickness profile that is as close as possible to the target profile. The thickness adjustments may be uniform, differential, or both uniform and differential, as described above.

Figure 13:
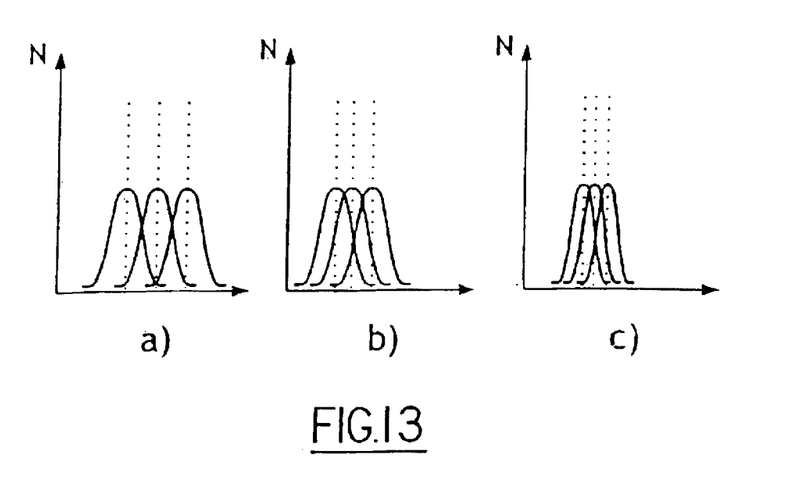
FIGS. 13a), 13b) and 13c) are diagrams of points on the surface of a batch of layers to the layer thicknesses, wherein FIG. 13a) shows the batch of layers at a time when the layers have not been subjected to thickness adjustment.
FIG. 13b) shows the same batch after implementation of a sacrificial oxidation treatment.
FIG. 13c) shows the same batch after a different implementation of a sacrificial oxidation treatment.

The method as applied to batches of layers can also be applied to a batch organized as a succession of layers, in which the mean thickness of one layer in the batch is measured (1051') while the thickness of the preceding layer in the same batch is being corrected (1053'), after the thickness of said preceding layer has itself been measured. An overall result of using a method of this type in accordance with the invention is shown in FIG. 13 which comprises three graphs 13a, 13b, and 13c. These three graphs represent histograms of thickness distribution amongst layers in a given batch (for simplification purposes, each batch is shown comprising three layers). Each histogram curve thus corresponds to a single layer, representing the number N of points on the surface of the layer that had a given thickness (thickness plotted along the abscissa axis, N up the ordinate axis). Each layer thus has a thickness which can typically be represented by a Gaussian curve (with the points at which thickness is determined being defined by a mesh over the surface of the layer). Vertical dotted lines represent the mean thickness of each layer.

Graph 13a thus shows a first distribution of thicknesses for the three layers in a batch. Each of these three layers presents a distribution of thicknesses about a respective mean thickness.

Graph 13b shows the same layers after treatment by sacrificial oxidation seeking to make the mean thicknesses of the layers uniform. For this purpose, a configuration was adopted in which the recipes selected for each layer were individualized, as a function of the measurements of the layer, and for the purposes of achieving a common target. This leads to the mean thicknesses of the layers in the batch to come closer together (better layer-to-layer or wafer-to-wafer uniformity).

It is also possible to consider that, a priori, the layers in each batch present similar thickness profiles, within given tolerances. This is true in particular when the layers in a given batch have previously been subjected to the same fabrication steps under the same conditions. Under such circumstances, it is possible to measure only some of the layers in the batch (or even only one layer), instead of measuring all of the layers of the batch. Depending on the result of this or these thickness measurement(s), a single recipe is deduced (automatically, or by an operator) for application to all of the layers in the batch for the purpose of correcting thickness.

Such treatment, the result of which is not shown in the figures, leads to a shift in the mean thickness values of the layers in the batch, without the values coming closer together (the shift is towards smaller values of mean thickness, because of the way thickness is corrected).

Finally, the particular thickness adjustment apparatus described above (of the RTP XE CENTURA™) merely constitutes a non-limiting example which is particularly well suited to correcting the thickness of a single layer at a time.

It is possible to implement the method of the invention using any apparatus for correcting the surface thickness of a layer. In particular, such apparatus can make it possible advantageously to correct layer thickness in selective manner.

It is recalled that the term "selective" is used herein to cover the ability to attack different regions of the surface of the layer in differential manner. By correcting the thickness of each layer in a selective and an individualized manner (which means that each layer whose thickness is to be corrected must be measured), it is possible to narrow the spread of the thickness distribution histogram for each layer of the batch, and also to move the mean thickness values of the layers closer together. This is shown by the graph 13c.

In all circumstances, thickness adjustment implements sacrificial oxidation.

It is thus possible, for example, to process entire batches of layers in horizontal or vertical tube ovens (where vertical tube ovens are also referred to as "bells)". Such annealing ovens are known in the state of the art. They enable entire batches of layers to be subjected to heat treatment. The layers are aligned one after another, e.g. in quartz boats provided with parallel notches for receiving the layers.

It is possible to adjust the characteristics of the heat treatment applied by the oven so as to apply selective thickness adjustment to the surface of each layer of the batch in different regions of the layer. For this purpose, action can be taken in particular on the composition of the mixture of gases inside the oven, and more precisely on the composition of the mixture of gases circulating in the various portions of the oven.

It is possible to provide that the mixture is more or less oxidizing in certain regions of the oven. This can be achieved by local flow of a specific gas mixture.

Thus, when it is desired to treat all of the layers in a batch in the same manner, all of the dispositions seeking to produce special conditions locally inside the oven are applied in the same manner to all of the layers in the batch.

It is also possible to act on the presence of hot zones inside the oven. In this case also, the presence of hot zones can be defined so as to have the same influence on all of the layers in a batch.

For example, provision can be made to ensure that the sacrificial oxidation attacks the layers more in their peripheral regions than in their central regions, which corresponds to a convex recipe.

It is possible to act on the flows of gas inside the oven, in order to obtain such hot zones.

In contrast, it is also possible to manage non-uniformities of temperature inside the oven in controlled manner so as to cause the heat treatment applied to the various layers in a batch to be different.

What is claimed is:

1. A method for adjusting the thickness of a thin semiconductor material layer which comprises:

measuring the layer to establish a thickness profile;

determining thickness adjustment specifications from the measured thickness profile; and adjusting the thickness of the layer in accordance with the specifications by sacrificial oxidation.

2. The method according to claim 1 wherein the thickness adjustment specifications correspond to at least one of uniform thickness modification across the layer, or differential thickness modification across the layer.

3. The method according to claim 1 wherein the thickness adjustment specifications are established to produce a layer having a constant thickness over the entire layer.

4. The method according to claim 1 which further comprises applying thickness adjustments simultaneously to the layer surface.

5. The method according to claim 1 further comprising preparing batches of layers for adjustment of layer thicknesses.

6. The method according to claim 5 further comprising performing layer thickness adjustment on the batches of layers.

7. The method according to claim 5 further comprising defining a final target thickness profile for all layers of the batch, and individualizing the respective thickness adjustment specifications for each layer of the batch so that a final layer thickness profile of each layer of the batch is as close as possible to the final target thickness profile.

8. The method according to claim 5 further comprising defining a single target thickness profile for all of the layers of the batch, and utilizing the same thickness adjustment specification for all of the layers of the batch, wherein the specification is a function of at least one thickness measurement performed on a layer of the batch.

9. The method according to claim 5 which further comprises defining a target thickness profile including a target value that designates a single target thickness to be achieved over the layer surface for each layer of the batch.

10. The method according to claim 1 which further comprises treating batches of layers, wherein one layer thickness in the batch is adjusted by a certain given pitch while a subsequent layer thickness is being measured.

11. The method according to claim 1 wherein the thickness profile is measured by at least one of an ellipsometer or a reflectometer.

12. The method according to claim 1 wherein the sacrificial oxidation is implemented by utilizing at least one of a thermal oxidation technique or a rapid thermal oxidation technique.

13. The method according to claim 1 which further comprises selectively oxidizing different locations of the layer during sacrificial oxidation.

14. The method according to claim 1 which further comprises selectively powering a plurality of heater lamps situated to face different locations of the layer during sacrificial oxidation to locally adjust the temperature at which the layer is oxidized.

15. The method according to claim 1 wherein the thin semiconductor material layer is an upper layer of a multilayer structure.

16. The method according to claim 15 wherein the upper layer is made of silicon.

17. The method according to claim 15 wherein the multilayer structure is an SOI structure.

18. An apparatus for adjusting the thickness of a thin semiconductor material layer comprising:

means for measuring the layer to establish a thickness profile;

means for determining thickness adjustment specifications from the measured thickness profile; and means for conducting sacrificial oxidation for adjusting the thickness of the layer in accordance with the specifications.

19. The apparatus according to claim 18 further comprising a processor unit operatively associated with the measuring means and the thickness adjustment means.

20. The apparatus according to claim 18 wherein the measuring means, the thickness adjustment means, and the processor unit are integrated in the apparatus.

21. The apparatus according to claim 18 wherein the measuring means is a reflectometer.

22. The apparatus according to claim 18 wherein the thickness adjustment means is suitable for treating the thickness of the entire surface of at least one layer simultaneously in a selective manner.

23. The apparatus according to claim 18 wherein the thickness adjustment means is adapted to adjust the thickness of one layer at a time.

24. The apparatus according to claim 23 wherein the thickness adjustment means is a tube oven.

25. The apparatus according to claim 18 wherein the thickness adjustment means enables the thickness of entire batches of layers to be adjusted at one time.

* * * * *

UNITED STATES PATENT AND TRADEMARK OFFICE
CERTIFICATE OF CORRECTION

PATENT NO. : 6,908,774 B2
DATED : June 21, 2005
INVENTOR(S) : Ghyselen et al.

Page 1 of 1

It is certified that error appears in the above-identified patent and that said Letters Patent is hereby corrected as shown below:

Column 20,
Line 51, before "adjusting the thickness of the layer" insert -- selectively --.

Column 22,
Line 11, before "sacrificial oxidation for adjusting" insert -- selective --.

Signed and Sealed this

Twenty-third Day of August, 2005

JON W. DUDAS
*Director of the United States Patent and Trademark Office*